(12) United States Patent
Liao et al.

(10) Patent No.: US 11,581,261 B2
(45) Date of Patent: Feb. 14, 2023

(54) CHIP ON FILM PACKAGE

(71) Applicant: Novatek Microelectronics Corp., Hsinchu (TW)

(72) Inventors: Chun-Yu Liao, Kaohsiung (TW); Teng-Jui Yu, Taoyuan (TW); Jr-Ching Lin, Hsinchu (TW); Wen-Ching Huang, Hsinchu (TW); Tai-Hung Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 42 days.

(21) Appl. No.: 17/186,005

(22) Filed: Feb. 26, 2021

(65) Prior Publication Data

US 2021/0183781 A1   Jun. 17, 2021

Related U.S. Application Data

(63) Continuation-in-part of application No. 16/005,710, filed on Jun. 12, 2018, now Pat. No. 10,937,713.

(51) Int. Cl.

| | | |
|---|---|---|
| *H01L 23/52* | (2006.01) | |
| *H01L 23/538* | (2006.01) | |
| *H01L 23/00* | (2006.01) | |
| *H01L 23/31* | (2006.01) | |
| *H01L 23/367* | (2006.01) | |

(52) U.S. Cl.
CPC ...... *H01L 23/5386* (2013.01); *H01L 23/3185* (2013.01); *H01L 23/367* (2013.01); *H01L 23/5387* (2013.01); *H01L 24/16* (2013.01); *H01L 24/17* (2013.01);

(Continued)

(58) Field of Classification Search
CPC ............. H01L 23/5386; H01L 23/3185; H01L 23/367; H01L 23/5387; H01L 24/16; H01L 24/17; H01L 23/4985
See application file for complete search history.

(56) References Cited

U.S. PATENT DOCUMENTS 7,561,436 B2 *  7/2009  Brandenburg ...... H01L 23/3677
                                                    257/718
8,963,195 B2 *  2/2015  Brooks ................. H01L 33/644
                                                    257/E23.116

(Continued)

FOREIGN PATENT DOCUMENTS

CN   106298729   1/2017
CN   106328601   1/2017

OTHER PUBLICATIONS

"Notice of allowance of China Counterpart Application", dated Jun. 9, 2022, p. 1-p. 4.

*Primary Examiner* — Nicholas J Tobergte
(74) *Attorney, Agent, or Firm* — JCIPRNET

(57) ABSTRACT

A chip on film package is disclosed, including a flexible film and a chip. The flexible film includes a film base, a patterned metal layer includes a plurality of pads and disposed on an upper surface of the film base, and a dummy metal layer covering a lower surface of the film base and capable of dissipating heat of the chip. The dummy metal layer comprises at least one opening exposing the second surface, and at least one of the plurality of pads is located within the at least one opening in a bottom view of the chip on film package. The chip is mounted on the plurality of pads of the patterned metal layer.

24 Claims, 10 Drawing Sheets

(52) U.S. Cl.
CPC ............... *H01L 2224/16227* (2013.01); *H01L 2224/17519* (2013.01); *H01L 2924/18161* (2013.01)

(56) References Cited

U.S. PATENT DOCUMENTS

| | | | | |
|---|---|---|---|---|
| 9,400,310 | B2* | 7/2016 | Cheng | G01R 31/2896 |
| 9,633,950 | B1* | 4/2017 | We | H01L 21/561 |
| 10,937,713 | B2* | 3/2021 | Liao | H01L 24/17 |
| 2002/0043704 | A1* | 4/2002 | Seko | H01L 23/49838 |
| | | | | 257/E21.503 |
| 2002/0043713 | A1* | 4/2002 | Seko | H01L 23/49838 |
| | | | | 257/692 |
| 2004/0145052 | A1* | 7/2004 | Ueno | G02F 1/13452 |
| | | | | 257/734 |
| 2005/0040521 | A1* | 2/2005 | Lawlyes | H01L 21/563 |
| | | | | 257/E23.09 |
| 2005/0077614 | A1* | 4/2005 | Chengalva | H01L 23/42 |
| | | | | 257/E23.087 |
| 2008/0079134 | A1* | 4/2008 | Lin | H01L 24/13 |
| | | | | 257/E33.056 |
| 2009/0166070 | A1* | 7/2009 | Lee | H05K 3/381 |
| | | | | 428/209 |
| 2012/0273928 | A1* | 11/2012 | Kim | H01L 23/4985 |
| | | | | 257/668 |
| 2017/0365547 | A1* | 12/2017 | Nakamura | H01L 23/3735 |
| 2019/0378777 | A1* | 12/2019 | Liao | H01L 23/50 |

* cited by examiner

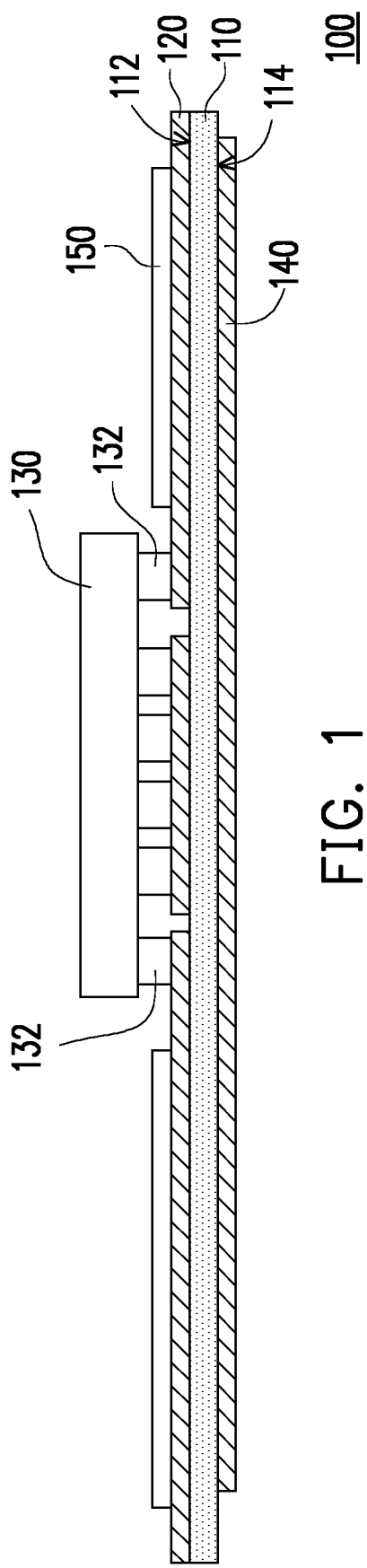
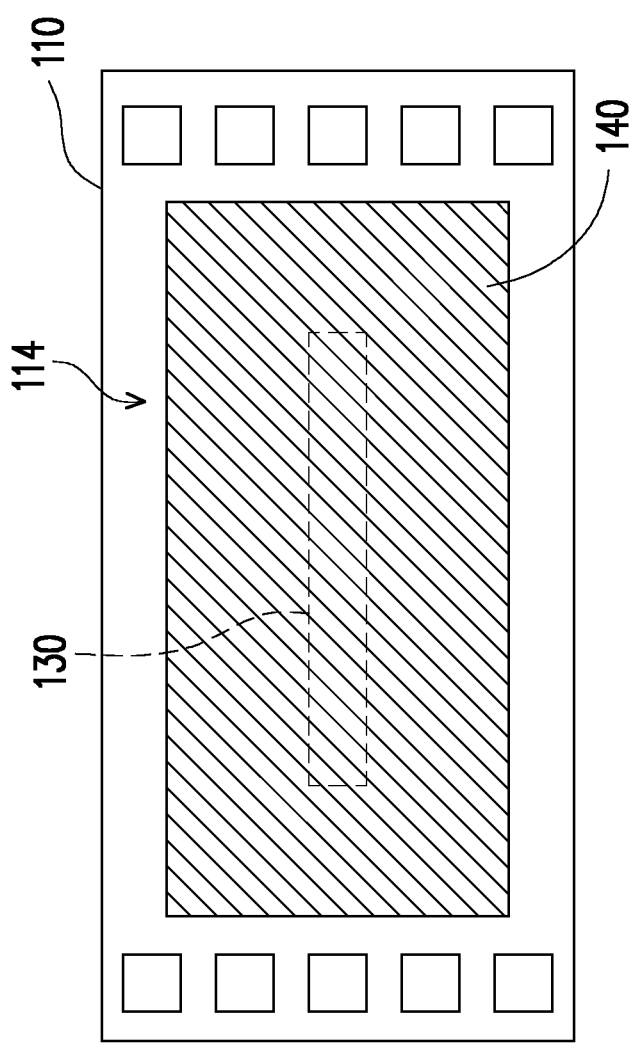

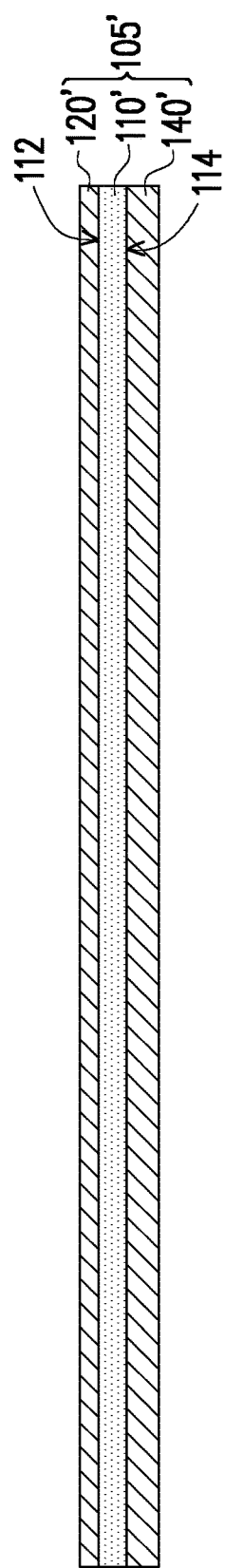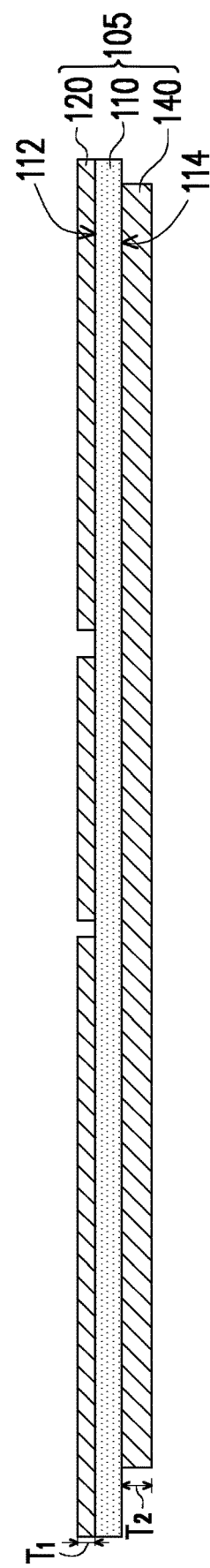

CHIP ON FILM PACKAGE

CROSS-REFERENCE TO RELATED APPLICATION

This application is a continuation-in-part application of and claims the priority benefit of a prior application Ser. No. 16/005,710, filed on Jun. 12, 2018. The entirety of the above-mentioned patent application is hereby incorporated by reference herein and made a part of this specification.

BACKGROUND

Technical Field

The present disclosure generally relates to a chip package. More particularly, the present disclosure relates to a chip on film package.

Description of Related Art

In electronic industry of nowadays, a flip chip with high efficiency is mounted on a flexible substrate to package the chip on film. The chip-on-film package structure can be applied to the electronic product with small size and light weight, such as integrated circuit (IC) chip. However, when the electronic product is working, the chip will generate heat and the heat cannot be always dissipated effectively. Furthermore, when the chip is being packaged and used, the chip may be damaged since the flexible substrate may be bended due to bad strength of the package structure. Then, the life of the electronic product will be shortened.

In the aforementioned chip-on-film package structure, the chip is mounted on the film substrate by flip-chip bonding. However, the flipped chip will generate heat during operation, and the heat can only be dissipated by the back surface of the chip. Furthermore, whenever the strength of the film substrate is not enough to support the chip thereon, the chip may be damaged as being packaged or used.

SUMMARY

Accordingly, the present disclosure is directed to a chip on film package with superior heat dissipation efficiency.

The present disclosure provides a chip on film package including a flexible film and a chip. The flexible film includes a film base, a patterned metal layer including a plurality of pads and disposed on an upper surface of the film base, and a dummy metal layer covering a lower surface of the film base. The dummy metal layer comprises at least one opening exposing the lower surface of the film base, and at least one of the plurality of pads is located within the at least one opening in the bottom view of the package. The chip is mounted on the plurality of pads of the patterned metal layer.

In light of the foregoing, the dummy metal layer of the chip on film package covers the lower surface (e.g. the second surface) of the flexible film (e.g., the film base). The dummy metal layer is electrically insulated from the circuit portion of the patterned metal layer on the upper surface (e.g. the first surface) of the flexible film. Accordingly, with the great area of dummy metal layer covering the back surface of the flexible film, the heat generated from the chip can be dissipated efficiently by the dummy metal layer, such that the heat dissipation efficiency of the chip on film package can be improved.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1 illustrates a cross sectional view of a chip on film package according to an embodiment of the disclosure.

FIG. 2 illustrates a bottom view of a chip on film package according to an embodiment of the disclosure.

FIG. 8 to FIG. 10 illustrates cross sectional views of intermediate stages in the manufacturing of a chip on film package according to an embodiment of the disclosure.

DESCRIPTION OF THE EMBODIMENTS

Figure 3:
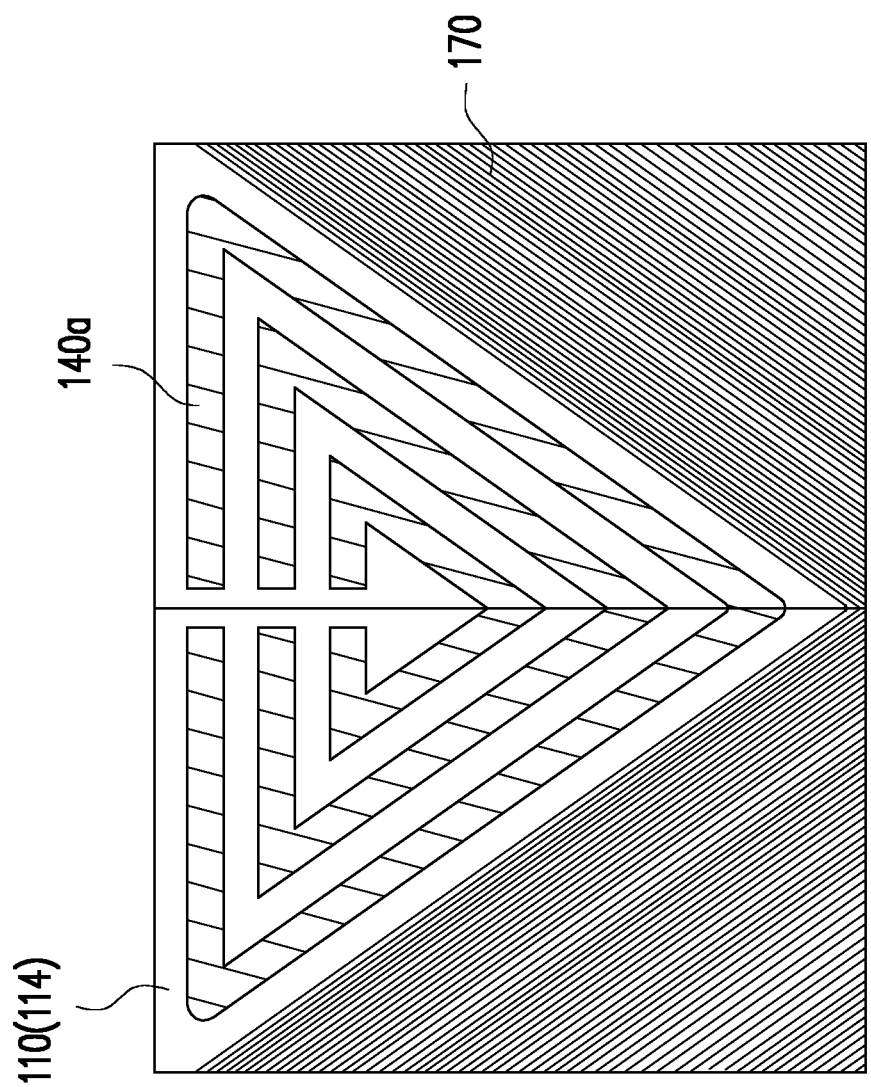
FIG. 3 illustrates a partially enlarged view of a dummy metal layer of a chip on film package according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

In some embodiments, a chip on film package is disclosed. The chip on film package can include a flexible film and a chip. The flexible film includes a film base, a patterned metal layer disposed on a first surface of the film base, and a dummy metal layer covering a second surface of the film base and capable of dissipating heat of the chip, and the chip is mounted on and electrically connected to the patterned circuit layer. In some embodiments, a thickness of the patterned metal layer may be different from a thickness of the dummy metal layer. With the dummy metal layer covering the lower surface of the film base of the flexible film, the heat generated from the chip can be dissipated efficiently by the dummy metal layer, such that the heat dissipation efficiency of the chip on film package can be improved.

In the same or alternative embodiments, the chip on film package can include a second patterned metal layer disposed on the second surface. The chip mounted on the first surface and electrically connected to the first patterned metal layer. The dummy metal layer covering the second surface is capable of (or mainly disposed for) dissipating heat of the chip. The second patterned metal layer may be electrically coupled to either or both of the first patterned metal layer and the chip. Preferably but not necessarily, the dummy metal layer is electrically insulated from the first patterned metal layer. Preferably but not necessarily, the dummy metal layer is electrically insulated from the second patterned metal layer.

In some embodiments, a chip on film package is disclosed. The chip on film package can include a flexible film and a chip. The flexible film includes a film base, a patterned metal layer disposed on an upper surface of the film base, and a continuous dummy metal layer covering a lower surface of the film base and having a non-patterned structure, wherein the continuous dummy metal layer is electrically insulated from the patterned metal layer. A chip is mounted on and electrically connected to the patterned metal layer. The continuous metal layer is capable of (or mainly disposed for) dissipating heat of the chip and having a non-patterned structure. Preferably but not necessarily, the continuous metal layer has an area greater than an area of the chip for better heat dissipation.

In some embodiments, a chip on film package is disclosed. The chip on film package can include a flexible film which can include a film base, a patterned metal layer disposed on an upper surface of the film base, and a non-circuit metal layer covering a lower surface of the film base and capable of dissipating heat of the chip, and a chip mounted on the first surface and electrically connected to the patterned metal layer. The non-circuit metal layer covers the lower surface capable of (or mainly disposed for) dissipating heat of the chip. Preferably but not necessarily, the non-circuit metal layer is a continuous metal layer or non-patterned metal layer.

FIG. 1 illustrates a cross sectional view of a chip on film package according to an embodiment of the disclosure. FIG. 1 is a cross sectional view along a short side of the chip. FIG. 2 illustrates a bottom view of a chip on film package according to an embodiment of the disclosure. Referring to FIG. 1 and FIG. 2, in some embodiments, a chip on film package 100 includes a flexible film 105 and a chip 130. The flexible film 105 includes a film base 110, a patterned metal layer 120 disposed on a first surface 112 of the film base 110 and a dummy metal layer 140 covering a second surface 114 of the film base 110. The film base 110 includes the first surface 112 and the second surface 114 opposite to the first surface 112, and the patterned metal layer 120 is provided on the first surface 112. The film base 110 may be made of a resin such as polyimide, polyester, or the like. The chip 130 is mounted on the flexible film 105 and has an active surface. A plurality of bumps 132 (and/or the dummy bumps 134 shown in FIG. 4) are formed on the active surface of the chip 130 and electrically connected to the patterned metal layer 120 of the flexible film 105. The patterned metal layer 120 can be served as non-floating circuits. A sealant may be coated between the chip 130 and the flexible film 105, wherein the sealant can be one selected from the group consisting of an under-filling material, a resin, an anisotropic conductive paste (ACP) and an anisotropic conductive film (ACF), etc.

The patterned metal layer 120 is disposed on the first surface 112. The chip 130 is mounted on the flexible film 105 and electrically connected to the patterned metal layer 120. In some embodiments, the chip on film package 100 may further include a solder resist layer 150. The solder resist layer 150 is disposed on the patterned metal layer 120 and formed before the chip 130 is mounted on the flexible film 105, and exposes a part of the patterned metal layer 120 where the chip 130 is mounted.

The dummy metal layer 140 covers the second surface 114 capable of dissipating heat of the chip 130. The dummy metal layer 140 is electrically insulated from the patterned metal layer 120 and is capable of dissipating heat of the chip 130.

In some embodiments, the dummy metal layer 140 has a floating voltage. In other words, the dummy metal layer 140 is not electrically connected to another non-floating conductor or node. Without such a connection, voltages and current flows are induced by electromagnetic fields or charge accumulation within the conductor rather than being due to the usual external potential difference of a power source.

In some other embodiments, the dummy metal layer 140 is electrically connected to a reference voltage. In other words, the dummy metal layer 140 is electrically connected to a fixed (constant) voltage irrespective of the loading on the chip 130, power supply variations, temperature changes, and the passage of time. In one of the implementations, the reference voltage is a ground voltage. Namely, the dummy metal layer 140 is grounded.

Preferably but not necessarily, the dummy metal layer 140 is a continuous metal layer covering the second surface 114 as it is shown in FIG. 2. In other words, the dummy metal layer 140 has a non-patterned structure. Namely, the dummy metal layer 140 is a non-patterned metal layer. The dummy metal layer 140 can be patterned or even separated in some implementations. In addition, the dummy metal layer 140 (e.g. continuous metal layer) preferably (but not necessarily) has an area greater than an area of the chip 130 as it is shown in FIG. 2. In some embodiments, a material of the dummy metal layer 140 includes copper, and the dummy metal layer 140 can be formed by electroplating process without any patterning process such as additive process, semi-additive process, subtractive process, etc. In some embodiments, the dummy metal layer 140 is a non-circuit metal layer covering the second surface 114 and capable of dissipating heat of the chip 130. It is noted that the additional metal layer can mean a non-circuit metal layer configured for or capable of dissipating heat of the chip, thus functioning differently from circuit metal layers configured for implementing circuits having specific functions such as amplification, computation, and data transfer. With such a configuration, the dummy metal layer 140 covering the second surface 114 of the film base 110 with great area of metal facilitates the heat dissipation of the chip 130.

FIG. 3 illustrates a partially enlarged view of a dummy metal layer of a chip on film package according to an embodiment of the disclosure. It is noted that the dummy metal layer of the chip on film package shown in FIG. 3 contains many features same as or similar to the chip on film package 100 disclosed earlier with FIG. 1 and FIG. 2. For purpose of clarity and simplicity, detail description of same or similar features may be omitted, and the same or similar reference numbers denote the same or like components. The main differences between the embodiment of FIG. 3 and the embodiment of FIG. 1 and FIG. 2 are described as follows.

Referring to FIG. 3, in some embodiments, the dummy metal layer 140a may be a patterned metal layer as it is shown in FIG. 3. In detail, the dummy metal layer 140a is a non-circuit patterned metal layer and can be formed by an electroplating process and a patterning process such as additive process, semi-additive process, subtractive process, etc. In one of the implementation, the patterned metal layer 120 disposed on the first surface 112 of the film base 110 is the first patterned metal layer.

In addition, the chip on film package in FIG. 3 may further include a second patterned metal layer 170 disposed on the second surface 114 of the film base 110. The second patterned metal layer 170 can be configured to facilitate the heat dissipation of the chip 130. The second patterned metal layer 170 can also serve as non-floating circuits of the chip on film package, which may or may not be electrically connected to the first patterned metal layer 120. The dummy metal layer 140a can cover at least a part of the rest of the second surface 114 not covered by the second patterned metal layer 170. In some embodiments, the dummy metal layer 140a is electrically insulated from the first patterned metal layer 120 and the second patterned metal layer 170 to facilitate the heat dissipation of the chip 130. In addition, since the dummy metal layer 140a fills the area not covered by the second patterned metal layer 170 on the second surface 114, the stress distribution on the second surface can be more evenly and uniformly. In the embodiment of the second patterned metal layer 170 and the dummy metal layer 140a disposed on the second surface 114, the dummy metal layer may also be a continuous metal layer having a non-patterned structure, which can cover at least a part of the rest of the second surface 114 not covered by the second patterned metal layer 170.

Figure 4:
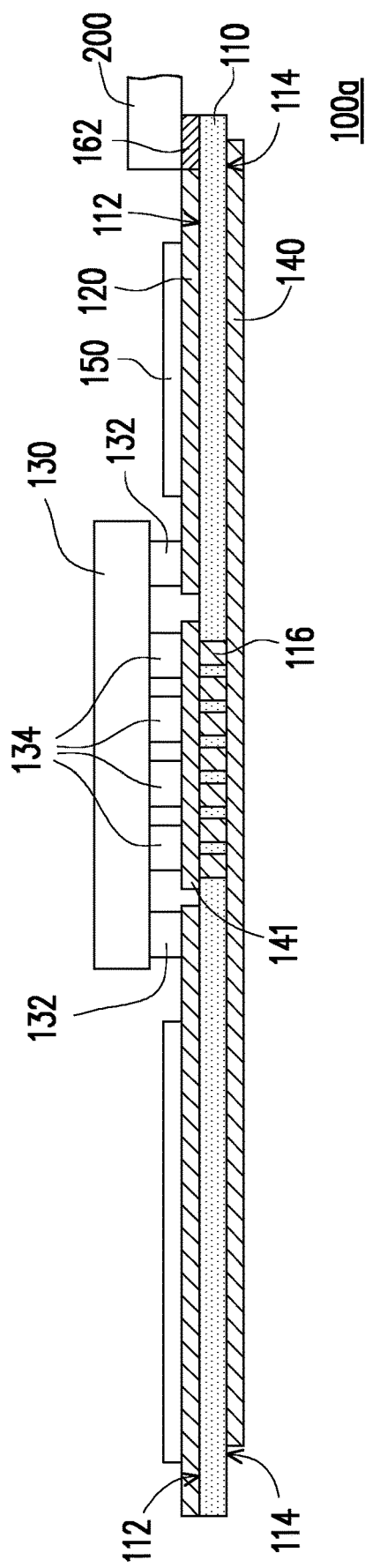
FIG. 4 illustrates a cross sectional view of a chip on film package according to an embodiment of the disclosure.

FIG. 4 illustrates a cross sectional view of a chip on film package according to an embodiment of the disclosure. It is noted that the chip on film package 100a shown in FIG. 4 contains many features same as or similar to the chip on film package 100 disclosed earlier with FIG. 1 and FIG. 2. For purpose of clarity and simplicity, detail description of same or similar features may be omitted, and the same or similar reference numbers denote the same or like components. The main differences between the chip on film package 100a shown in FIG. 4 and the chip on film package 100 shown in FIG. 1 and FIG. 2 are described as follows.

Referring to FIG. 4, in some embodiments, the chip 130 includes one or more signal bumps 132 and one or more dummy bumps 134. The signal bumps 132 are electrically connected to the patterned metal layer 120 for, for example, signal transmitting purpose. The dummy bumps 134 can be thermally coupled to the chip 130 and can be electrically insulated from either or both of the signal bumps 132 and the patterned metal layer 120. In some embodiments, the film base 110 further includes one or more vias 116 electrically connecting the dummy metal layer 140 and the dummy bumps 134. In some embodiments, the chip on film package 100a may further include an extra dummy metal layer 141 disposed on the first surface 112. As such, the dummy bumps 134 are connected to the extra dummy metal layer 141, and the extra dummy metal layer 141 is electrically insulated from the patterned metal layer 120. Accordingly, the vias 116 are electrically connected to the dummy bumps 134 through the extra dummy metal layer 141 on the first surface 112.

With such an arrangement, the heat generated by the chip 130 can be conducted to the dummy metal layer 140 through the heat conducting path formed of the dummy bumps 134, the extra dummy metal layer 141, and the vias 116, and the heat can be dissipated to external environment via the dummy metal layer 140 on the second surface 114. In some embodiments, the patterned metal layer 120 may further include a plurality of signal pads 162 electrically connected to the patterned metal layer 120, such that a substrate 200 (e.g. a glass substrate, a printed circuit board, etc.) can be bonded to the chip on film package 100a through the signal pads 162. Preferably but not necessarily, the dummy metal layer 140 can be electrically insulated from the signal pads 162.

Figure 5:
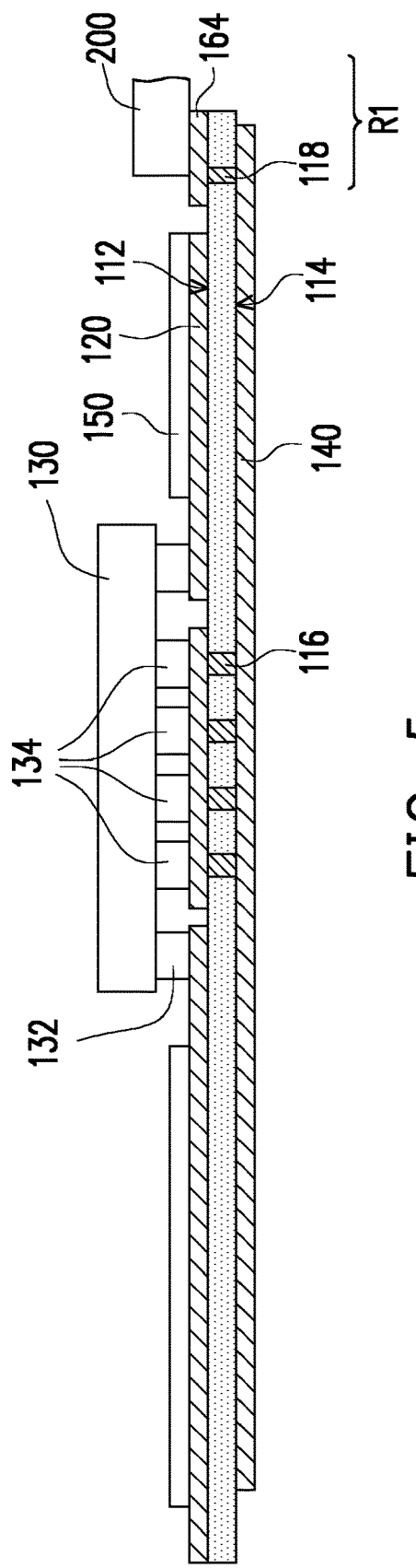
FIG. 5 illustrates a cross sectional view of a chip on film package according to an embodiment of the disclosure.

FIG. 5 illustrates a cross sectional view of a chip on film package according to an embodiment of the disclosure. It is noted that the chip on film package 100b shown in FIG. 5 contains many features same as or similar to the chip on film package 100a disclosed earlier with FIG. 4. For purpose of clarity and simplicity, detail description of same or similar features may be omitted, and the same or similar reference numbers denote the same or like components. The main differences between the chip on film package 100b shown in FIG. 5 and the chip on film package 100a shown in FIG. 4 are described as follows.

Referring to FIG. 5, in some embodiments, the flexible film 105 may further include a bonding region R1 configured to be bonded to a substrate 200. In some embodiments, the substrate 200 may be a glass substrate, a printed circuit board or any other suitable substrate. The bonding region R1 includes a plurality of signal pads (e.g. the signal pad 162 as shown in FIG. 4), which are electrically connected to the patterned metal layer 120 for transmitting signals between the chip 130 and the substrate 200. The dummy metal layer 140 is electrically insulated from the signal pads 162.

In some embodiments, the chip 130 may further include the dummy bumps 134, which can be thermally coupled to the chip 130 and/or can be electrically insulated from either or both of the signal bumps 132 and the patterned metal layer 120. In some embodiments, dummy bumps 134 are thermally coupled to the dummy metal layer 140 through the vias 116 to facilitate the heat dissipation of the chip 130. In some embodiments, the bonding region R1 further includes a plurality of dummy pads 164. In addition, the dummy pads 164 can be electrically insulated from either or both of the signal pads 162 and the patterned metal layer 120, and/or the dummy metal layer 140 can be thermally coupled to the dummy pads 164. In one implementation, the film base 110 may further include one or more vias 118 penetrating the film base 110. Accordingly, the dummy pads 164 are thermally coupled to the dummy metal layer 140 through the vias 118. With such a configuration, the heat from the chip 130 may be conducted to the dummy metal layer 140 through the heat conducting path formed of the dummy bumps 134, and the vias 116. In addition, the heat from the substrate 200 may also be conducted to the dummy metal layer 140 through the heat conducting path formed of the dummy pads 164, and the vias 118, such that the heat from the chip 130 and the substrate 200 can be dissipated to external environment via the dummy metal layer 140 on the second surface 114.

Figure 6:
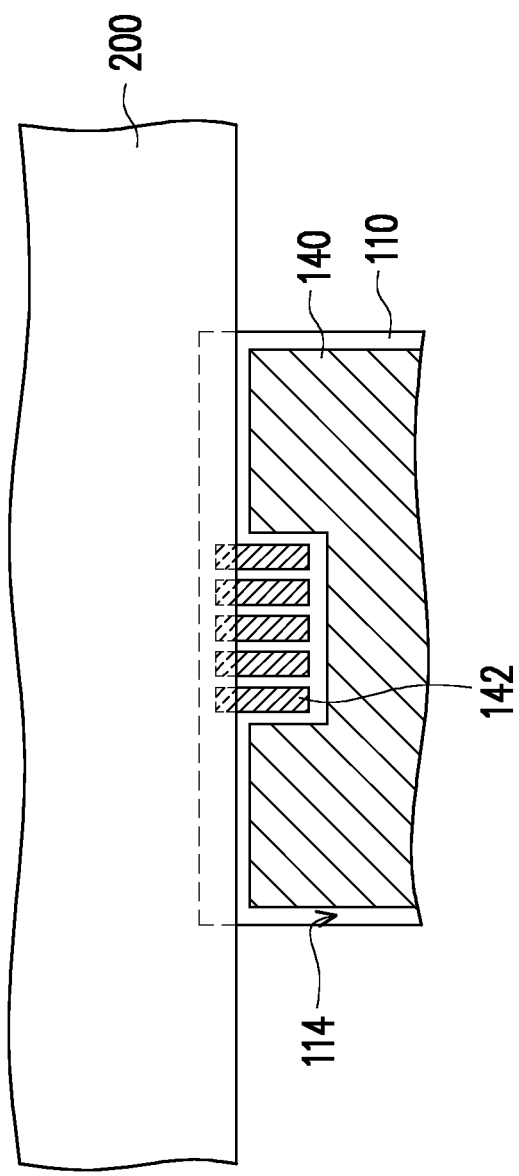
FIG. 6 illustrates a bottom view of a chip on film package according to an embodiment of the disclosure.
Figure 7:
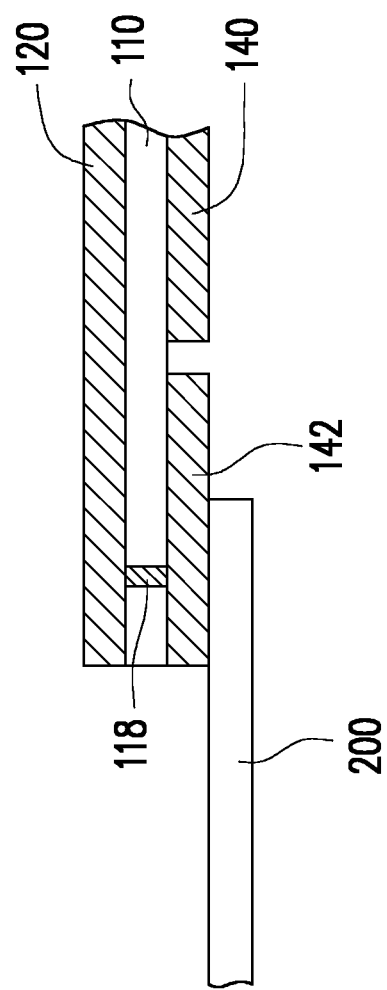
FIG. 7 illustrates a cross sectional view of a chip on film package according to an embodiment of the disclosure.

FIG. 6 illustrates a bottom view of a chip on film package according to an embodiment of the disclosure. FIG. 7 illustrates a cross sectional view of a chip on film package according to an embodiment of the disclosure. It is noted that the chip on film package shown in FIG. 6 and FIG. 7 may contain many features same as or similar to the chip on film package 100a disclosed with FIG. 4. For purpose of clarity and simplicity, detail description of same or similar features is omitted, and the same or similar reference numbers denote the same or like components. The main differences between the chip on film package shown in FIG. 6 and FIG. 7 and the chip on film package 100a shown in FIG. 4 are described as follows.

In some embodiments, referring to FIG. 6 and FIG. 7, the chip on film package may further include a patterned metal layer 142 disposed on the second surface 114. The patterned metal layer 142 may function as a plurality of signal pads (similar to the signal pad 162 shown in FIG. 4), and can be electrically connected to the patterned metal layer 120 through via 118 (not shown). The dummy metal layer 140 can be electrically insulated from the patterned metal layer 142 as shown in FIG. 7.

Referring to FIG. 5 to FIG. 7, the chip in the present embodiment may be similar to the chip 130 shown in FIG. 5, which may further include the dummy bumps 134. The dummy bumps 134 may be thermally coupled to the chip 130 and/or electrically insulated from the signal bumps 132 and the patterned metal layer 120. In some embodiments, the dummy bumps 134 are thermally coupled to the dummy metal layer 140 through the vias 116 to facilitate the heat dissipation of the chip 130.

With such configuration, the heat from the chip 130 and the substrate 200 can be dissipated to external environment via the dummy metal layer 140 on the second surface 114 (with or without the help of the dummy bumps 134 and the vias 116). In addition, the substrate 200 may be bonded to the patterned metal layer 142, which is electrically insulated from the dummy metal layer 140.

Figure 10:
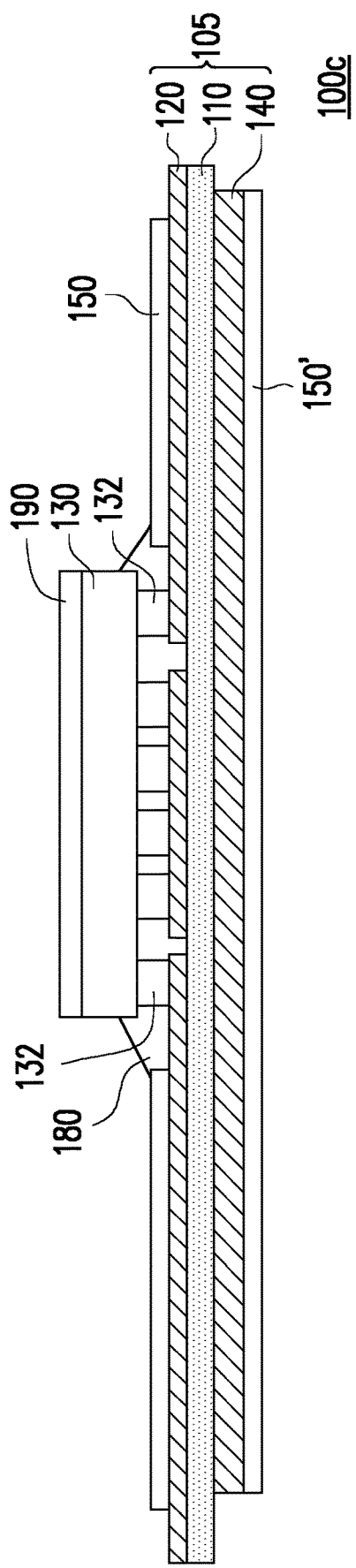

FIG. 8 to FIG. 10 illustrates cross sectional views of intermediate stages in the manufacturing of a chip on film package according to an embodiment of the disclosure. In some embodiments, the process of forming the flexible film 105 may include the following steps. Referring to FIG. 8, an unprocessed flexible film 105' may be provided. In detail, the flexible film 105' may be a two-layered copper clad laminate (CCL) structure, which includes two metal layers (e.g., copper foils) 120' and 140' applied on two opposite surfaces of a film base 110'. Generally speaking, the copper clad laminate structure may act as a flexible substrate, and means a thin laminate consisting of the insulating layer onto which copper is thinly applied.

In some exemplary embodiments, the copper clad laminate structure may include a glass/epoxy CCL, a heat-resistant resin CCL, a paper/phenol CCL, a high-frequency CCL, a flexible CCL (polyimide film), a complex CCL and the like, in accordance with its use. In the present embodiment, the flexible film 105' is a flexible CCL, which means the film base 110' is a polyimide film, but the disclosure is not limited thereto. In some embodiments, the flexible film 105' may be produced by forming a metal (copper) layer with a submicron-level thickness on the film base 110' by sputtering and then forming another metal (copper) layer by copper-sulfate plating. Accordingly, the thickness of the metal layer 120' is different from a thickness of the metal layer 140'. In the present embodiments, the thickness of the metal layer 140' on the second surface 114 of the film base 110' is substantially greater than the thickness of the metal layer 120' on the first surface 112 of the film base 110'. However, the disclosure is not limited thereto. In other embodiments, the thickness of the metal layer 140' on the second surface 114 of the film base 110' may be substantially smaller than the thickness of the metal layer 120' on the first surface 112 of the film base 110'.

Then, referring to FIG. 9, a patterning process is performed on the flexible film 105' to form the patterned metal layer 120 and the dummy metal layer 140 on the film base 110. For example, a dry film may be provided on the flexible film 105', and then the dry film along with the flexible film 105' are then exposed to form a pattern, and the unwanted parts of the metal layers 120', 140' were eliminated by, for example, etching processing using the foregoing etching solution in order to form the patterned metal layer 120 (and the dummy metal layer 140 if necessary). Accordingly, the thickness T1 of the dummy metal layer 140 on the second surface 114 of the film base 110 is substantially greater than the thickness T2 of the patterned metal layer 120 on the first surface 112 of the film base 110. However, the disclosure is not limited thereto. In other embodiments, the thickness T2 of the dummy metal layer 140 may be substantially smaller than the thickness T1 of the patterned metal layer 120. The features of the dummy metal layer 140 may be the same or at least similar to the dummy metal layer 140 in the previous embodiments. For purpose of clarity and simplicity, detail description of same or similar features may be omitted, and the same or similar reference numbers denote the same or like components.

Then, referring to FIG. 10, the rest of the process may be similar to the previous embodiments. For example, the chip 130 is mounted on the flexible film 105 and electrically connected to the patterned metal layer 120. In some embodiments, a sealant 180 may be provided (coated) between the chip 130 and the flexible film 105, wherein the sealant 180 can be one selected from the group consisting of an underfilling material, a resin, an anisotropic conductive paste (ACP) and an anisotropic conductive film (ACF), etc. In some embodiments, the solder resist layer 150 may be disposed on the patterned metal layer 120 and exposes a part of the patterned metal layer 120 where the chip 130 is mounted. In the present embodiment, a lower solder resist layer 150' may also be disposed to cover the dummy metal layer 140. In some optional embodiments, a heat dissipation layer 190 may be disposed on a back surface of the chip 130 to further help the heat dissipation of the chip 130. The heat dissipation layer 190 may be a heat dissipation film, a heat dissipation paste, or the like. Though not shown in FIG. 10, the size of the heat dissipation layer 190 may be large enough to cover the entire back surface of chip 130 and is attached to the solder resist layer 150 by adhesive material. At the time, a manufacturing process of the chip on film package 100c may be substantially completed. In some embodiments, the dummy metal layer 140 covers the second surface 114 of the film base 110. Accordingly, the dummy metal layer 140 is electrically insulated from the patterned metal layer 120 and is capable of dissipating heat of the chip 130.

Figure 11:
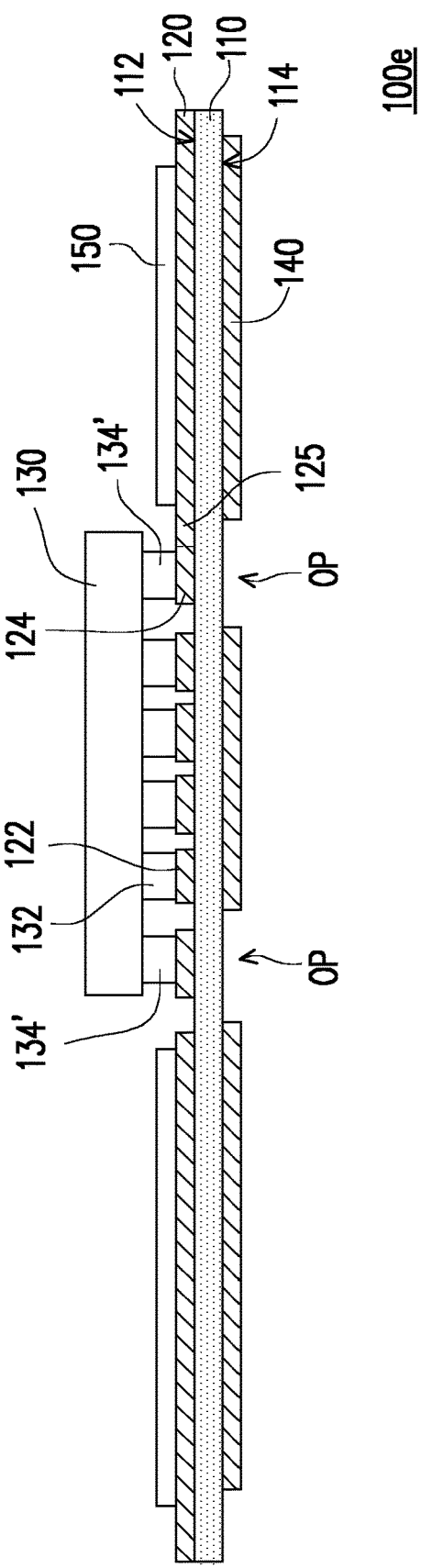
FIG. 11 illustrates a cross sectional view of a chip on film package according to an embodiment of the disclosure.
Figure 12:
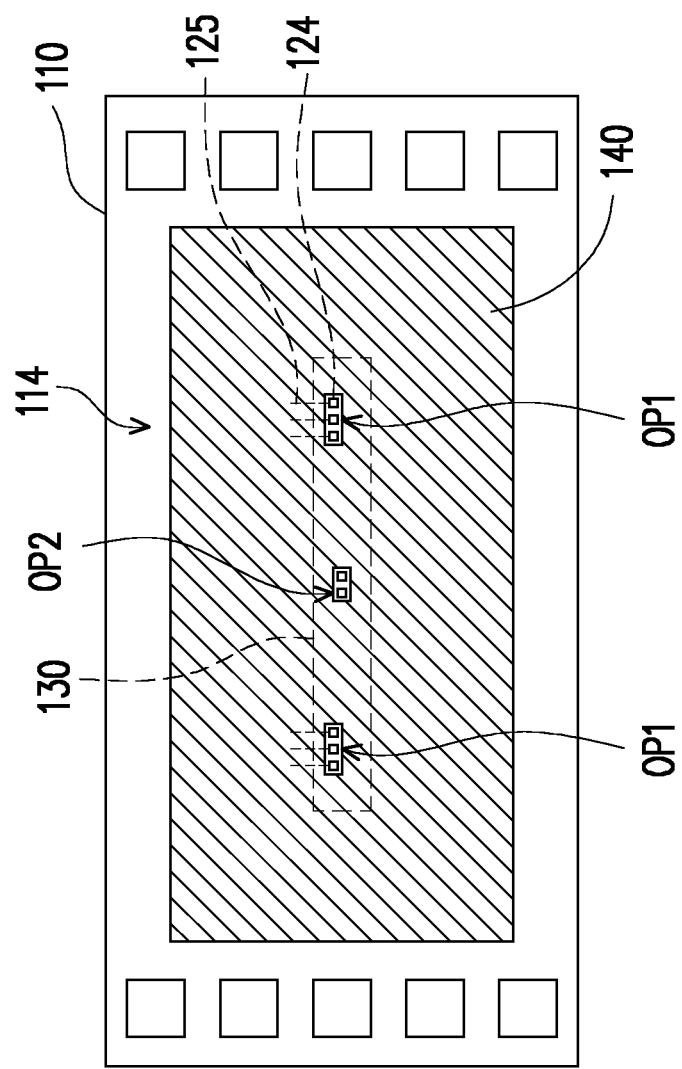
FIG. 12 illustrates a bottom view of a chip on film package according to an embodiment of the disclosure.

FIG. 11 illustrates a cross sectional view of a chip on film package according to an embodiment of the disclosure. FIG. 12 illustrates a bottom view of a chip on film package according to an embodiment of the disclosure. It is noted that the chip on film package shown in FIG. 11 and FIG. 12 contains many features same as or similar to the chip on film packages disclosed earlier with FIG. 1 to FIG. 10. For purpose of clarity and simplicity, detail description of same or similar features may be omitted, and the same or similar reference numbers denote the same or like components. The main differences between the chip on film package shown in FIG. 11 and FIG. 12 and the chip on film packages shown in the previous embodiments are described as follows.

Referring to FIG. 11 and FIG. 12, in some embodiments, the patterned metal layer 120 may include a plurality of pads 122 which are configured to connect those bumps in inner rows of bumps of the chip 130 and a plurality of pads 124 which are configured to connect those bumps in the outmost row of bumps of the chip 130, and the chip 130 is mounted on the pads 122, 124. In the present embodiment, the dummy metal layer 140 may include at least one opening OP (a plurality of openings OP are illustrated, but not limited thereto) exposing the second surface 114 of the film base 110. In some embodiments, at least one of the pads 124 is located within a region where the opening OP is at the opposite surface, and the least one of the pads 124 can be seen in a bottom view of the package 100e. In some embodiments, the chip on film package 100e may include a solder resist layer 150 disposed on the patterned metal layer 120 and exposing a part of the patterned metal layer 120 where the chip 130 is mounted.

In some embodiments, the pads 124 are dummy pads and may be connected to dump (bonding) bumps 134' and dummy traces 125, and anyone of the pads 122 may be either a signal pad electrically connected to the signal (bonding)

bumps 132 (as shown in FIG. 11) of the chip for signal transmission or a dummy pad electrically connected to other dummy bumps. In some embodiments, the dummy pads 124 are electrically insulated from the signal pads 122 for thermal dissipation and/or stress distribution and the dummy pads 124 may be connected to the dummy bumps 134' of the chip 130. In some embodiments, each of the dummy pads 124 may be at a floating voltage or being connected to a reference voltage, such as a ground voltage, etc.

With such configuration, even though the dummy metal layer 140 is formed prior to the bonding process of the chip 130, whether the chip is properly aligned and bonded to the flexible film 105 can be checked through the openings OP in the bottom view of the package 110e, since the film base 110 is transparent. By configuring the openings OP which enclose an area at which the dummy pads 124 and their corresponding dummy bumps can be seen, technicians may eye-check the alignment between the chip 130 and the flexible film 105 through the openings OP in a bottom view of the package 100e after the chip 130 is mounted on the flexible film 105.

In some embodiments, the patterned metal layer 120 may include a plurality of signal traces which are connected signal bumps 132 and a plurality of dummy traces 125. In some embodiments, the signal traces are electrically connected to the signal pads 122, while the dummy traces 125 are electrically insulated from the signal traces. In the embodiment of the dummy traces 125 connected to the dummy pads 124, and a part of the dummy traces 125 may also be seen through the openings OP in the bottom view of the package 110e. The dummy traces 125 may be floating voltage (such that the pads are at a floating voltage), or a reference voltage such as a ground voltage (such that the pads 124 are connected to the reference voltage). In the present embodiment, the openings OP are formed only in regions where the dummy pads 124 are, not in regions where the signal pads 122 are, at the opposite surface of the film base 110 for alignment checking, so the possible damage due to, for example, stress concentration, would not occur to the signal pads 122. However, in an alternative embodiment, another openings OP where the signal pads 122 are located within (seen in the bottom view of the package) may be formed in the dummy metal layer 140. The disclosure is not limited thereto.

In some embodiments, the openings OP may include a plurality of first openings OP1 located on regions corresponding to two opposite sides of the chip 130. In addition, some of the dummy pads 124 are located within the first openings OP1 which are corresponding to the two opposite sides of the chip 130 in the bottom view of a package 100j, as illustrated in FIG. 12. Accordingly, the dummy pads 124 and the corresponding dummy bumps 134' may be seen through the openings OP1 in the bottom view of the package 100j for alignment checking, so as to inspect whether the chip 130 are properly aligned and bonded to the flexible film 105.

In some embodiments, the openings OP may further include at least one second opening OP2, which is located at a region corresponding to a center of the chip 130. In addition, some of the dummy pads 134' corresponding to the center of the chip 130 are located within the second openings OP2 in the bottom view of the package 100j. Accordingly, the dummy pads 124 and the corresponding dummy bumps 134' that are located at the center of the chip 130 may be seen through the second openings OP2 for alignment checking, so as to inspect whether the chip 130 are also properly aligned and bonded to the flexible film 105. In some embodiments, a size of one of the openings OP is different from a size of another one of the openings OP. For example, in the embodiment shown in FIG. 12, the size of the second openings OP2 is smaller than the size of the first openings OP1, but the disclosure is not limited thereto.

Figure 13:
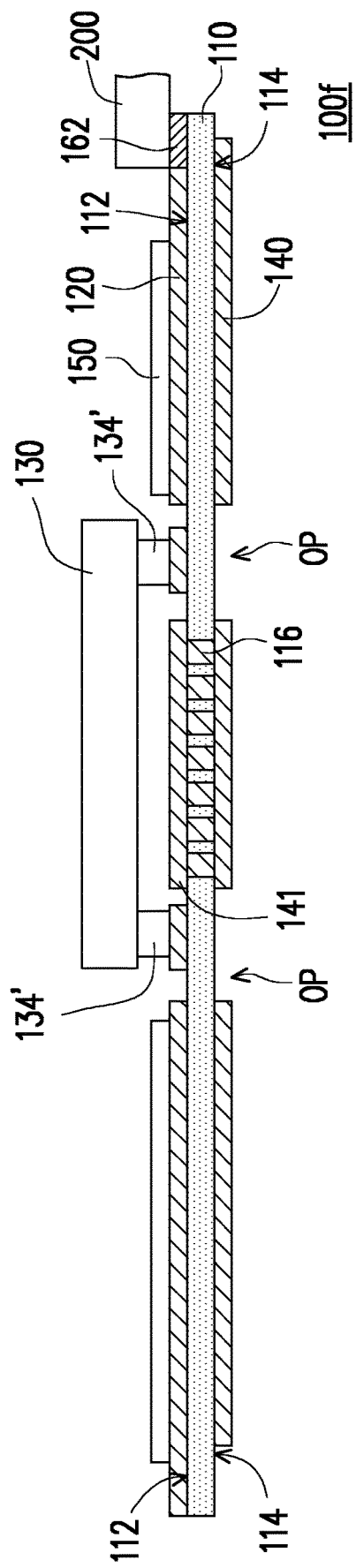
FIG. 13 illustrates a cross sectional view of a chip on film package according to an embodiment of the disclosure.

FIG. 13 illustrates a cross sectional view of a chip on film package according to an embodiment of the disclosure. It is noted that the chip on film package shown in FIG. 13 contains many features same as or similar to the chip on film packages disclosed earlier with FIG. 1 to FIG. 12. For purpose of clarity and simplicity, detail description of same or similar features may be omitted, and the same or similar reference numbers denote the same or like components. The main differences between the chip on film package shown in FIG. 13 and the chip on film packages shown in the previous embodiments are described as follows.

With now reference to FIG. 13, in some embodiments, the chip on film package 100f may further include an extra dummy metal layer 141 disposed on the first surface 112 of the film base 110 and electrically insulated from the patterned metal layer 120 In the present embodiment, there may be no bumps connected to the extra dummy metal layer 141 as it is shown in FIG. 13. Comparatively, as illustrated in FIG. 4, the dummy bumps 134' may be connected to the extra dummy metal layer 141). In some embodiments, the flexible film 105 may further include at least one via 116 connecting the dummy metal layer 140 and the extra dummy metal layer 141 for thermal coupling and heat dissipation.

In some embodiments, the flexible film 105 may further include a bonding region R1 configured to be bonded to a substrate 200. In some embodiments, the substrate 200 may be a glass substrate, a printed circuit board or any other suitable substrate. The bonding region R1 includes a plurality of signal bonding pads (e.g. the signal bonding pad 162 as shown in FIG. 13), which are electrically connected to the patterned metal layer 120 for transmitting signals between the chip 130 and the substrate 200. Preferably but not necessarily, the dummy metal layer 140 can be electrically insulated from the signal bonding pads 162.

Figure 14:
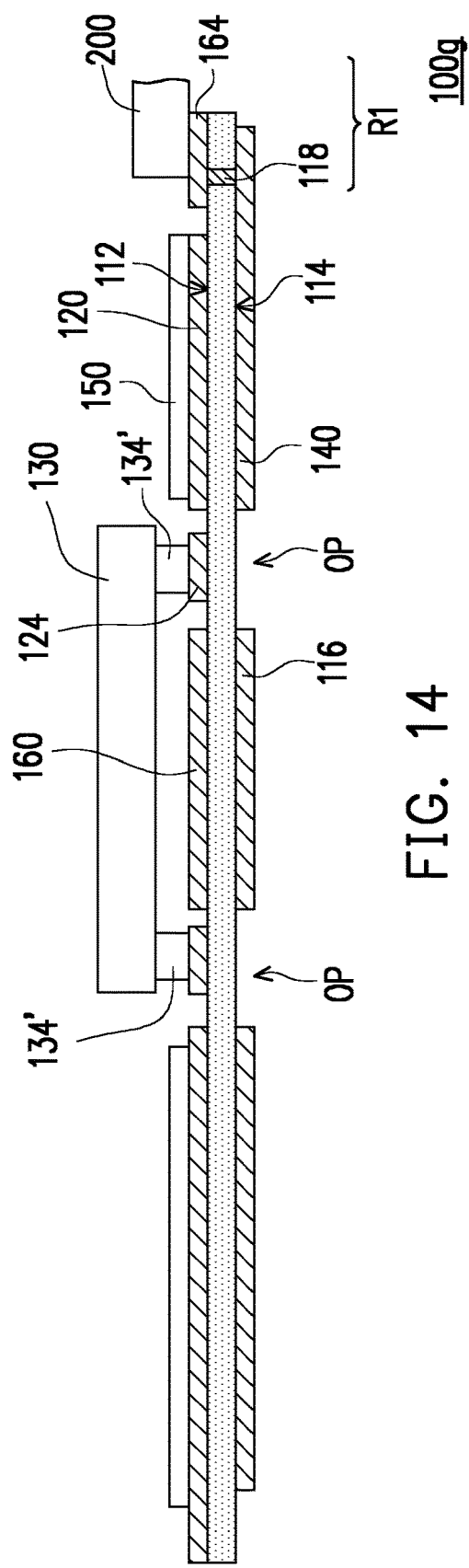
FIG. 14 illustrates a cross sectional view of a chip on film package according to an embodiment of the disclosure.

FIG. 14 illustrates a cross sectional view of a chip on film package according to an embodiment of the disclosure. It is noted that the chip on film package shown in FIG. 14 contains many features same as or similar to the chip on film packages disclosed earlier with FIG. 1 to FIG. 13. For purpose of clarity and simplicity, detail description of same or similar features may be omitted, and the same or similar reference numbers denote the same or like components. The main differences between the chip on film package 100g shown in FIG. 14 and the chip on film packages shown in the previous embodiments are described as follows.

With now reference to FIG. 14, in some embodiments, there may not be any vias connecting between the extra dummy metal layer 141 on the first surface 112 and the dummy metal layer 140 on the second surface 114. The extra dummy metal layer 141 may be configured on the first surface 112 and under the chip 130 for heat dissipation. In the present embodiment, there may be no bumps connected to the extra dummy metal layer 141 as it is shown in FIG. 13 or there may be dummy bumps 134' connected to the extra dummy metal layer 141. The disclosure is not limited thereto.

In some embodiments, the bonding region R1 may further includes a plurality of dummy bonding pads 164, which can be electrically insulated from either or both of the signal bonding pads 162 and the patterned metal layer 120, and/or the dummy metal layer 140 can be thermally coupled to the dummy bonding pads 164. In one implementation, the film base 110 may further include one or more vias 118 penetrating the film base 110. Accordingly, the dummy bonding pads 164 are thermally coupled to the dummy metal layer 140 through the vias 118. With such a configuration, the heat from the chip 130 may be conducted to the dummy metal layer 140 through the heat conducting path formed of the dummy 'bumps 134', and the vias 116. In addition, the heat from the substrate 200 may also be conducted to the dummy metal layer 140 through the heat conducting path formed of the dummy bonding pads 164, and the vias 118, such that the heat from the chip 130 and the substrate 200 can be dissipated to external environment via the dummy metal layer 140 on the second surface 114.

Figure 15:
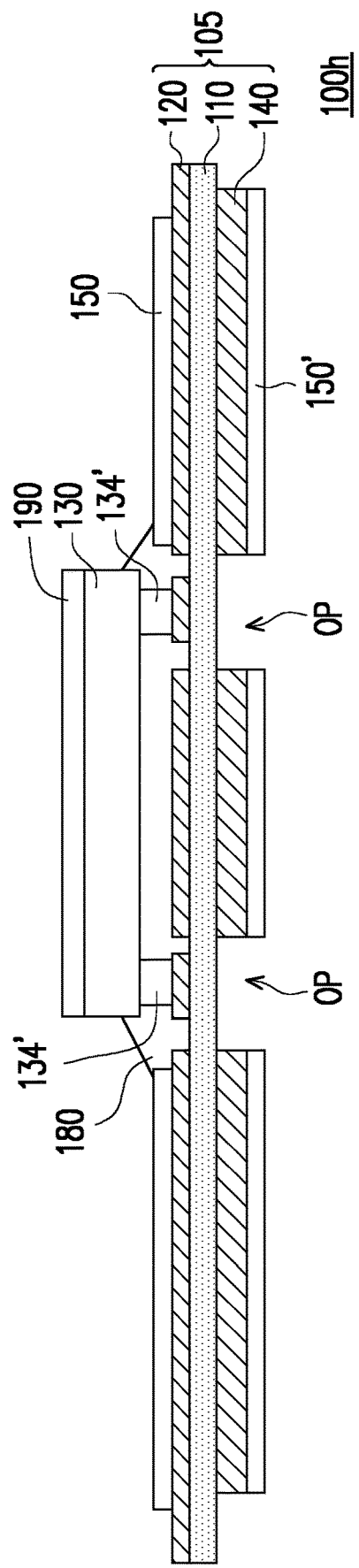
FIG. 15 illustrates a cross sectional view of a chip on film package according to an embodiment of the disclosure.

FIG. 15 illustrates a cross sectional view of a chip on film package according to an embodiment of the disclosure. It is noted that the chip on film package 100h shown in FIG. 15 contains many features same as or similar to the chip on film packages disclosed earlier with FIG. 1 to FIG. 14. For purpose of clarity and simplicity, detail description of same or similar features may be omitted, and the same or similar reference numbers denote the same or like components. The main differences between the chip on film package 100h shown in FIG. 15 and the chip on film packages shown in the previous embodiments are described as follows.

With now reference to FIG. 15, in some embodiments, the chip on film package 100h may further include a lower solder resist layer 150' disposed on the dummy metal layer 140 and exposing the openings OP. However, in the embodiment of the lower solder resist layer 150' being transparent, the lower solder resist layer 150' may cover the openings OP. The disclosure is not limited thereto as long as the dummy pads 124 and the corresponding dummy bumps 134' can be seen from the openings OP. In some embodiments, the chip on film package 100h may further include a heat dissipation layer 190 disposed on a back surface of the chip 130 for further heat dissipation of the chip 130. For example, the heat dissipation layer 190 may include a heat dissipation film or a heat dissipation paste.

In sum, at least one additional metal layer or at least one dummy metal layer of the chip on film package can cover the back surface (e.g. the second surface 114) of the flexible film. The additional or dummy metal layer can be electrically insulated from the patterned metal layer on the top surface (e.g. the first surface 112) of the flexible film. Accordingly, with the metal layer covering the back surface of the flexible film, the heat generated from the chip can be dissipated efficiently by the additional/dummy metal layer, such that the heat dissipation efficiency of the chip on film package can be improved. It is noted that the additional metal layer can mean a non-circuit metal layer configured for or capable of dissipating heat of the chip, thus functioning differently from circuit metal layers configured for implementing circuits. The non-circuit metal layer can be a continuous metal layer or a non-patterned metal layer. Additionally or alternatively, the additional metal layer can be a continuous metal layer covering the second surface capable of dissipating heat of the chip and having a non-patterned structure. Preferably but not necessarily, the continuous metal layer has an area greater than an area of the chip.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package, comprising:
a flexible film comprising a film base, a patterned metal layer comprising a plurality of pads and disposed on a first surface of the film base, and a dummy metal layer covering a second surface of the film base, wherein the dummy metal layer comprises at least one opening exposing the second surface, and at least one of the plurality of pads is located within a region directly opposite the at least one opening in the dummy metal layer; and
a chip mounted on the plurality of pads of the patterned metal layer.

2. The chip on film package as claimed in claim 1, wherein the dummy metal layer has a floating voltage.

3. The chip on film package as claimed in claim 1, wherein the dummy metal layer is connected to a reference voltage.

4. The chip on film package as claimed in claim 3, wherein the reference voltage is a ground voltage.

5. The chip on film package as claimed in claim 1, wherein the at least one of the plurality of pads located within the region directly opposite the at least one opening is a plurality of dummy pads.

6. The chip on film package as claimed in claim 5, wherein the patterned metal layer comprises a plurality of dummy traces connected to the plurality of dummy pads, and a part of the dummy traces are located within the region directly opposite the at least one opening.

7. The chip on film package as claimed in claim 1, wherein the at least one of the plurality of pads located within the region directly opposite the at least one opening is grounding.

8. The chip on film package as claimed in claim 1, wherein the at least one opening comprises a plurality of first openings located on regions corresponding to two opposite sides of the chip.

9. The chip on film package as claimed in claim 8, wherein the at least one opening comprises a plurality of openings, and a size of one of the plurality of openings is different from a size of another one of the plurality of openings.

10. The chip on film package as claimed in claim 8, wherein the at least one opening further comprises a second opening located at a region corresponding to a center of the chip.

11. The chip on film package as claimed in claim 5, wherein the chip comprises a plurality of signal bumps bonded to a plurality of signal pads and a plurality of dummy bumps bonded to the plurality of dummy pads electrically insulated from the plurality of signal pads.

12. The chip on film package as claimed in claim 1, further comprising an extra dummy metal layer disposed on the first surface and electrically insulated from the patterned metal layer.

13. The chip on film package as claimed in claim 12, wherein the flexible film further comprises at least one via connecting the dummy metal layer and the extra dummy metal layer.

14. The chip on film package as claimed in claim 1, further comprising a solder resist layer disposed on the patterned metal layer and exposing a part of the patterned metal layer where the chip is mounted.

15. The chip on film package as claimed in claim 1, further comprising a lower solder resist layer disposed on the dummy metal layer and exposing the at least one opening.

16. The chip on film package as claimed in claim 1, wherein the flexible film further comprises a bonding region configured to be bonded to a substrate, the bonding region comprises a plurality of signal bonding pads electrically connected to the patterned metal layer.

17. The chip on film package as claimed in claim 16, wherein the dummy metal layer is electrically insulated from the plurality of signal bonding pads.

18. The chip on film package as claimed in claim 16, wherein the substrate comprises a glass substrate or a printed circuit board.

19. The chip on film package as claimed in claim 16, wherein the bonding region comprises a plurality of dummy bonding pads, and the dummy metal layer is electrically connected to the dummy bonding pads.

20. The chip on film package as claimed in claim 19, wherein the flexible film further comprises a plurality of vias electrically connecting the dummy metal layer and the dummy bonding pads.

21. The chip on film package as claimed in claim 1, wherein the dummy metal layer has an area greater than an area of the chip.

22. The chip on film package as claimed in claim 1, wherein a material of the dummy metal layer comprises copper.

23. The chip on film package as claimed in claim 1, further comprising a heat dissipation layer disposed on a back surface of the chip.

24. The chip on film package as claimed in claim 1, wherein a thickness of the patterned metal layer is different from a thickness of the dummy metal layer.

\* \* \* \* \*